(12) United States Patent
Reznik

(10) Patent No.: US 11,948,856 B2
(45) Date of Patent: Apr. 2, 2024

(54) HEAT SINK FOR AN ELECTRONIC COMPONENT

(71) Applicant: Siemens Aktiengesellschaft, Munich (DE)

(72) Inventor: Daniel Reznik, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/768,737

(22) PCT Filed: Nov. 6, 2018

(86) PCT No.: PCT/EP2018/080266
§ 371 (c)(1),
(2) Date: Jun. 1, 2020

(87) PCT Pub. No.: WO2019/110219
PCT Pub. Date: Jun. 13, 2019

(65) Prior Publication Data
US 2021/0175146 A1    Jun. 10, 2021

(30) Foreign Application Priority Data
Dec. 4, 2017   (DE) .................. 10 2017 221 778.2

(51) Int. Cl.
*H01L 23/373*  (2006.01)
*B22F 10/28*  (2021.01)
(Continued)

(52) U.S. Cl.
CPC .......... *H01L 23/3733* (2013.01); *B22F 10/28* (2021.01); *H01L 21/4871* (2013.01);
(Continued)

(58) Field of Classification Search
CPC .................................................. H01L 23/3733
See application file for complete search history.

(56) References Cited

U.S. PATENT DOCUMENTS 5,981,085 A * 11/1999 Ninomiya ........... H01L 21/4871
257/712
9,587,309 B1    3/2017 Pickens et al.
(Continued)

FOREIGN PATENT DOCUMENTS

CN    107426942 A    12/2017   ............... H05K 7/20
DE    196 475 90    5/1998   ............. H01L 25/18
(Continued)

OTHER PUBLICATIONS

Search Report for International Application No. PCT/EP2018/080266, 12 pages, dated Jan. 21, 2019.
(Continued)

*Primary Examiner* — Benjamin P Sandvik
(74) *Attorney, Agent, or Firm* — Slayden Grubert Beard PLLC

(57) ABSTRACT

Various embodiments include a heat sink comprising: a base plate with an assembly surface for an electronic component; and a cooling structure bonded to the base plate increasing a surface area of the heat sink. The base plate comprises a metal-ceramic composite with a ceramic phase and a metallic phase. The cooling structure comprises a metal. A bond between the cooling structure and the base plate consists of a purely metallic bond between the cooling structure and the metallic phase of the base plate.

4 Claims, 2 Drawing Sheets

(51) Int. Cl.
  *H01L 21/48* (2006.01)
  *B33Y 80/00* (2015.01)
  *C22C 29/06* (2006.01)

(52) U.S. Cl.
  CPC .......... *H01L 23/3736* (2013.01); *B33Y 80/00* (2014.12); *C22C 29/065* (2013.01)

(56) References Cited

U.S. PATENT DOCUMENTS

| | | | |
|---|---|---|---|
| 11,167,375 B2* | 11/2021 | Schiffres | B22F 10/28 |
| 2009/0255660 A1* | 10/2009 | Cornie | H01L 23/3677 |
| | | | 165/185 |
| 2010/0175853 A1 | 7/2010 | Ebert | 165/80.2 |
| 2010/0290490 A1 | 11/2010 | Hammel et al. | 372/36 |
| 2014/0321063 A1* | 10/2014 | Uhlemann | H01L 21/4871 |
| | | | 219/137 R |
| 2016/0069622 A1 | 3/2016 | Alexiou | 165/146 |
| 2016/0175929 A1* | 6/2016 | Colin | B23K 26/342 |
| | | | 219/76.12 |
| 2016/0322280 A1 | 11/2016 | Schmit et al. | 257/710 |
| 2017/0113265 A1 | 4/2017 | Slavens et al. | 249/184 |
| 2018/0235101 A1* | 8/2018 | Franke | H01L 23/3736 |
| 2020/0036159 A1 | 1/2020 | Wolf et al. | |

FOREIGN PATENT DOCUMENTS

| | | | | |
|---|---|---|---|---|
| DE | 102007030389 A1 | 10/2008 | ............ | H01L 23/36 |
| DE | 102007061599 A1 | 7/2009 | ............ | H01L 23/34 |
| DE | 102012103786 A1 | 10/2013 | ............ | C04B 37/02 |
| DE | 10 2014 105 727 | 6/2015 | ............ | H01L 23/36 |
| DE | 10 2014 201 306 | 7/2015 | ............ | H01L 23/36 |
| DE | 10 2015 215 570 | 2/2017 | ............... | H05K 7/20 |
| DE | 102016218522 B3 | 6/2017 | ............ | H01L 21/58 |
| EP | 1067587 A2 | 1/2001 | ............ | C30B 25/10 |
| GB | 2 311 414 | 9/1997 | ......... | H01L 23/373 |
| GB | 2 327 150 | 1/1999 | ........... | H01L 23/373 |
| JP | 2016027595 A | 2/2016 | ........... | H01L 23/373 |
| WO | 01/45882 | 6/2001 | ............ | B22D 19/00 |
| WO | 2009/062732 | 5/2009 | ......... | H01L 23/373 |
| WO | 2011/095406 A1 | 8/2011 | ........... | H01L 23/373 |
| WO | 2015/017631 A1 | 2/2015 | ............... | B23P 6/00 |

OTHER PUBLICATIONS

Office Action for DE Application No. 10 2017 221 778.2, 8 pages, dated Mar. 1, 2018.
Chinese Office Action, Application No. 201880078296.5, 8 pages, dated Jan. 11, 2023.
Chinese Office Action, Application No. 201880078296.5, 10 pages, dated Jun. 28, 2023.

* cited by examiner

HEAT SINK FOR AN ELECTRONIC COMPONENT

CROSS-REFERENCE TO RELATED APPLICATIONS

This application is a U.S. National Stage Application of International Application No. PCT/EP2018/080266 filed Nov. 6, 2018, which designates the United States of America, and claims priority to DE Application No. 10 2017 221 778.2 filed Dec. 4, 2017, the contents of which are hereby incorporated by reference in their entirety.

TECHNICAL FIELD

The present disclosure relates to heat sinks. Various embodiments may include heat sinks with a base plate having an assembly surface for an electronic component, wherein the base plate is connected to a cooling structure that increases the surface area of the heat sink, electronic assemblies having an interconnect device with at least one electronic component mounted thereon and having a heat sink, and/or methods of producing a heat sink by an additive manufacturing method, wherein the base plate is part of the heat sink.

BACKGROUND

Electronic assemblies typically have to be cooled. In the case of power electronics modules, for example, semiconductor chips are constructed on a ceramic plate as a substrate. A heat sink may be secured to the reverse side of this ceramic substrate, which may have a single- or multipart construction. In some cases, a base plate may be attached to the ceramic substrate, for example by soldering, in which case the base plate can be connected to a further heat sink via screw connections, in order to increase the cooling performance. This may be a passive cooler for air cooling, for example via fins, or an active cooler with a channel system for a cooling medium such as air, water, a water-glycol mixture or silicone oil. In order to improve the connection between the heat sink and the base plate, a thermal transfer medium, for example a heat-conductive paste, may be provided between these components. However, the thermal conductivity of a heat-conductive paste is typically 2 orders of magnitude worse than that of metallic materials.

DE 10 2015 215 570 A1 describes a cooler additively manufactured by selective laser melting by using a base plate in order to construct a cooling structure thereon. This is a passive cooling structure with cooling channels that each open into chimneys and hence promote convection of cooling air. The heat sink is manufactured from metallic materials in order to assure good conduction of heat. Metallic materials can also be manufactured efficiently by additive manufacturing methods, for example laser melting.

Additive manufacturing methods in the context of this application refer to methods in which the material from which a component is to be produced is added to the component during its formation. This directly gives rise to the component in its ultimate shape or at least approximately in this shape. The build material may, for example, be pulverulent or liquid, and the additive manufacturing method chemically or physically solidifies the material for production of the component. Examples of additive manufacturing may include selective laser sintering (SLS), selective laser melting (SLM), electron beam melting (EBM), laser metal deposition (LMD), gas dynamic cold spraying (GDCS). These methods are especially suitable for processing of metallic materials in the form of powders, with which construction components can be produced.

In the case of SLM, SLS, and EBM, the components are produced layer by layer in a powder bed. These methods are therefore also referred to as powder bed-based additive manufacturing methods. In each case, a layer of the powder is produced in the powder bed, which is then locally melted or sintered by the energy source (laser or electron beam) in those regions in which the component is to form. Thus, the component is gradually manufactured layer by layer and can be removed from the powder bed on completion.

In the case of LMD and GDCS, the powder particles are supplied directly to the surface on which material is to be applied. In the case of LMD, the powder particles are melted directly by a laser at the site of incidence on the surface and form a layer of the component to be produced. In the case of GDCS, the powder particles are significantly accelerated, such that they adhere to the surface of the component primarily owing to their kinetic energy with simultaneous deformation.

A feature common to GDCS and SLS is that the powder particles are not completely melted in these methods. In the case of GDCS, melting is effected at most in the edge region of the powder particles, which can melt at their surface owing to the significant deformation. In the case of SLS, in choosing the sintering temperature, it is ensured that this is below the melting temperature of the powder particles. By contrast, in the case of SLM, EBM and LMD, the energy input is deliberately sufficiently high in terms of magnitude that the powder particles are completely melted.

Another particular problem in the case of power circuits formed on a ceramic substrate is that the cooler secured to the reverse side of the ceramic substrate, owing to the choice of metallic materials, for example aluminum or copper, has a higher coefficient of thermal expansion than the ceramic substrate. Therefore, during operation, there is thermal stress between the substrate and the heat sink, which is associated with mechanical stresses on the assembly.

SUMMARY

The teachings of the present disclosure describe heat sinks and electronic assembly comprising such a heat sink in such a way that, firstly, minimum mechanical stresses arise on heating of the heat sink and of the component to be cooled and, secondly, good dissipation of heat from the component to be cooled into the heat sink can be achieved. For example, some embodiments include a heat sink having a base plate (18) that has an assembly surface for an electronic component, wherein the base plate (18) is connected to a cooling structure (19) that increases the surface area of the heat sink, characterized in that the base plate (18) consists of a metal-ceramic composite including a ceramic phase (38) and a metallic phase (39), and the cooling structure (19) consists of a metal or a metal alloy, wherein a purely metallic bond is formed between the cooling structure (19) and the metallic phase (39) of the base plate (18).

In some embodiments, the metallic bond is formed by a metallic joining auxiliary (25).

In some embodiments, the metallic phase (39) of the base plate and the cooling structure (19) consist of the same metallic material or of metal alloys with the same base alloy component.

In some embodiments, the metallic bond consists of a weld bond.

In some embodiments, the base plate (18) consists of a metal-matrix composite, especially of AlSiC.

In some embodiments, the cooling structure is endowed with fins (32) or pimples (30).

In some embodiments, a channel (35) for a cooling medium is formed in the cooling structure.

As another example, some embodiments include an electronic assembly having a substrate (24) as interconnect device with at least one electronic component (26) mounted thereon, and having a heat sink, characterized in that the substrate (24) consists of a ceramic material and the substrate is secured on a mounting side of a heat sink designed according to any of the preceding claims.

As another example, some embodiments include a method of producing a heat sink by an additive manufacturing method, in which a cooling structure (19) is additively manufactured on a base plate (18), characterized in that the base plate (18) consists of a metal-ceramic composite including a ceramic phase (38) and a metallic phase (39), and the cooling structure (19) is produced from a metal or a metal alloy, wherein a purely metallic bond is formed between the material of the cooling structure (19) and the metallic phase (39) of the base plate (18) during the solidifying of the material of the cooling structure (19).

In some embodiments, the base plate (18) is inserted into a system for additively manufacturing the heat sink and the cooling structure (19) is additively manufactured on the base plate.

In some embodiments, an electronic circuit has been premounted on the base plate (18).

In some embodiments, the base plate (18) is designed as part of a power electronics module.

In some embodiments, the base plate (18) is additively manufactured in the system for additive manufacture from a mixture of a ceramic material and a metallic material.

In some embodiments, the additive manufacturing method performed is a selective laser melting method or an electron beam melting method.

BRIEF DESCRIPTION OF THE DRAWINGS

Further details of the teachings herein are described hereinafter with reference to the drawing. Identical or corresponding drawing elements are each given the same reference numerals and are only elucidated more than once to the extent that differences arise between the individual figures. The working examples elucidated hereinafter are only example embodiments of the invention. In the working examples, the described components of the embodiments are each individual features of the invention that are to be considered independently, which also in each case independently further develop the scope of the disclosure and hence should also be regarded as part of the disclosure individually or in a combination other than that disclosed. Furthermore, the embodiments described can also be supplemented by further features of the disclosure that have already been described.

The figures show.

DETAILED DESCRIPTION

Figure 1:
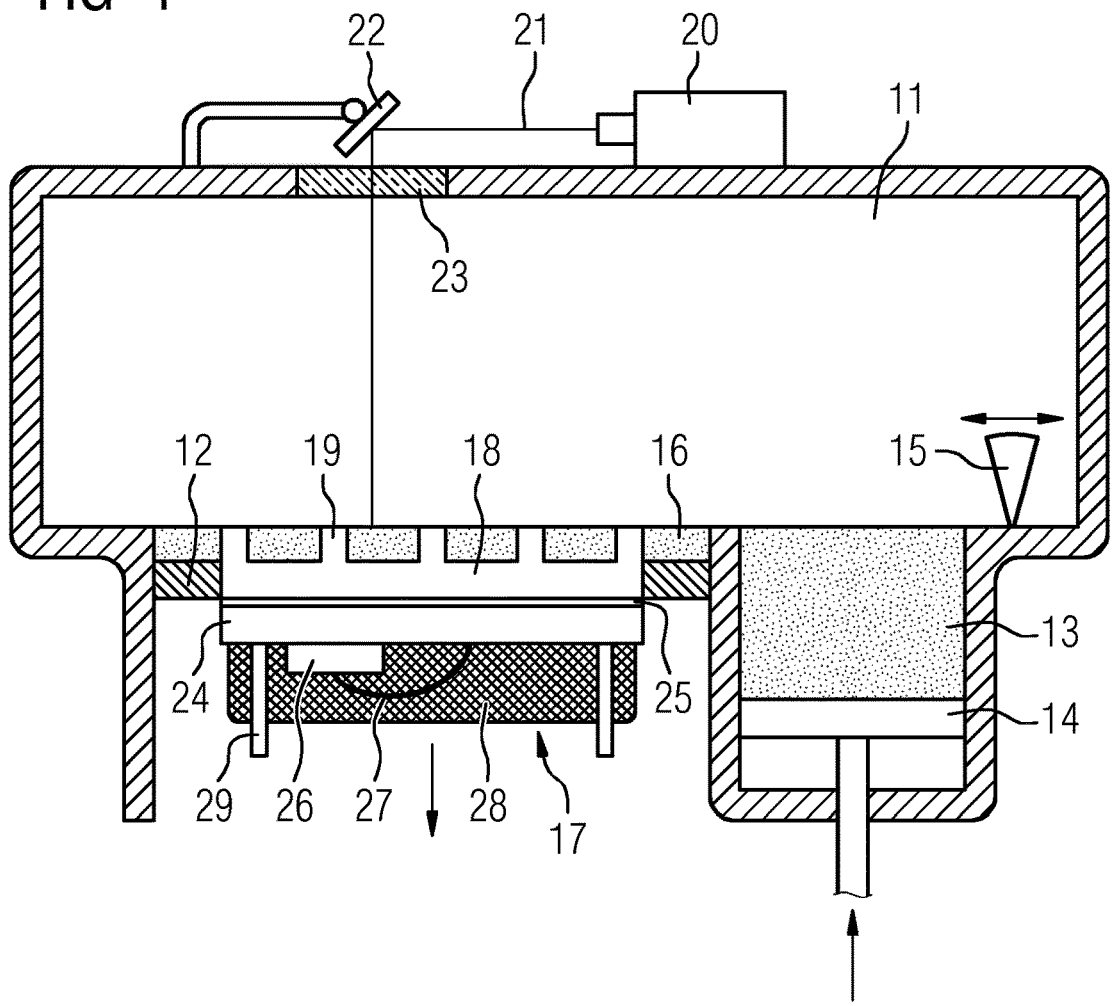
FIG. 1 a working example of a method incorporating teachings of the present disclosure in a system for selective laser melting, in partial cross section.

In some embodiments, a heat sink includes a base plate including a metal-ceramic composite including a ceramic phase and a metallic phase, and the cooling structure consists of a metal or a metal alloy, wherein a purely metallic bond is formed between the cooling structure and the metallic phase of the base plate. This purely metallic bond may be a weld bond, a solder bond, or a sinter bond. In some embodiments, good heat transfer can take place between the base plate and the cooling structure. This heat transfer is not disrupted, for example, by an assembly gap, nor by material-related phase transitions when a heat-conductive paste, for example, is provided in the assembly gap.

In some embodiments, the formation of a weld bond provides the metallic phase of the base plate forms one phase with the material of the cooling structure, and there is therefore no longer any phase transition in the weld bond. As a result, the heat can flow unhindered from the metallic phase of the base plate into the cooling structure, since phase transitions would generate additional thermal resistance. In connection with this application, phase transitions shall always be understood to mean transitions from one material to a different material. Phase transitions within a material, for example through grain boundaries, are not to be discussed in connection with this application.

In some embodiments, the metallic bond may be formed by a metallic joining aid. This is customary especially in the case of solder bonds, where a solder material is introduced into the gap between the components to be bonded as metallic joining aid. This enables a bond between the metallic phase of the base plate and the cooling structure. In some embodiments, in the heat sink, there is also heat transfer between the ceramic phase of the base plate and the cooling structure to the extent that the ceramic phase is in contact with the cooling structure. However, the function of a heat conduction is fulfilled mainly by the metallic phase of the base plate.

In some embodiments, a ceramic phase in the base plate matches in terms of its coefficient of thermal expansion to ceramic substrates that can be mounted on the mounting surface of the heat sink. As a result, it is possible to reduce the mechanical stresses on heating of an assembly consisting of the heat sink and a component to be cooled, for example a power electronics circuit with a ceramic substrate. At the same time, the metallic phase of the base plate, owing to the metallic bonding of the cooling structure, assures good conduction of heat, such that the heat sink combines the advantages of thermal expansion characteristics matched to ceramics at the mounting surface with good cooling performance.

In some embodiments, the electronic component may include, for example, a ceramic substrate for constructing a power electronics circuit. In some embodiments, the electronic components themselves to be attached directly to the mounting surface of the heat sink. If these components are semiconductor components, these likewise profit from adjustment of the coefficient of thermal expansion at the mounting surface of the heat sink, since these likewise have a lower coefficient of thermal expansion than metals.

In some embodiments, the base plate may be a metal-matrix composite. The metal therein forms a matrix in which ceramic particles are embedded. In that case, the heat is conducted mainly through the metallic matrix, such that it is not necessary to overcome any phase boundaries within the base plate. The metal-matrix composite used may be a composite composed of aluminum and silicon carbide (Al-SiC). It is produced by compacting a silicon carbide powder which is then infiltrated with liquid aluminum, which then penetrates into the interspaces and forms a pore-free composite material. In this way, it is of course also possible to produce metal-matrix composites from other materials, such that, by choice of a suitable powder, good adaptation of the coefficient of thermal expansion to the component to be cooled is possible.

In some embodiments, the metallic phase of the base plate and the cooling structure consist of the same metallic material or of metal alloys with the same base alloy component. As already elucidated, this can achieve the effect that, after the bonding of the cooling structure to the metallic phase of the base plate, there is no longer any phase transition in the purely metallic bond, such that particularly good conduction of heat at the transition between the base plate and the cooling structure is assured. To gain this advantage, it is not necessary to use identical metal alloys in the base plate and the cooling structure. Instead, it is sufficient when these have the same base alloy component, the base alloy component in the context of the invention being understood to mean that alloy component of the metal alloy that has the greatest alloy content in the alloy. Metallic materials used may additionally also be pure metals, where these may likewise have minor alloy components or impurities. Suitable pure metals or base alloy components, owing to their very good thermal conduction properties, are especially aluminum, copper and silver, and aluminum here constitutes the least costly alternative.

In some embodiments, the cooling structure includes fins or pimples. These are geometric structures that increase the surface area of the cooling structure and hence improve release of heat. It is possible here for the fins or pimples to be part of an air cooler, such that the heat is released to the ambient air. Another option is for the fins and pimples to be disposed in a liquid cooling medium to form a channel for a cooling medium in the cooling structure, such that it can be forcibly conducted. This leads to faster exchange of the cooling medium. More particularly, it is also possible to use a liquid cooling medium. In this case, the channel may be closed from the outside in order that no loss of the liquid cooling medium occurs. In some embodiments, the fins or pimples may be disposed in the channel.

Some embodiments include an electronic assembly having an interconnect device comprising a ceramic material and the interconnect device is secured on a mounting side of a heat sink designed according to the construction principles elucidated above. In some embodiments, the coefficient of thermal expansion of the heat sink on the assembly surface is matched or at least approximated to the coefficient of thermal expansion of the interconnect device, such that heating of the electronic assembly results in minor mechanical stresses. At the same time, via the metallic phase of the base plate, good conduction of heat into the cooling structure of the heat sink is possible (as already elucidated).

Some embodiments include a method for additive manufacturing of a heat sink, wherein the base plate comprises a metal-ceramic composite including a ceramic phase and a metallic phase, and the cooling structure is produced from a metal or a metal alloy, wherein a purely metallic bond is formed between the material of the cooling structure and the metallic base plate during the solidifying of the material of the cooling structure. This is preferably a weld bond when, for example, an SLS or EBM or an LMD is employed as additive manufacturing method. In the case of GDCS, a low-temperature weld bond is generated. In the case of SLS, owing to the lower energy input than in the case of SLM, a sinter bond is formed.

In some embodiments, it is possible to manufacture heat sinks that have the advantages described above (matched coefficient of thermal expansion combined with good thermal conductivity characteristics). By choice of the additive manufacturing method, moreover, it is possible to achieve a high degree of individualization of the heat sink in the specific individual case. For example, it is possible to rework standard modules with a metal-ceramic base plate in order, for example, to construct a closed cooling channel. Moreover, the cooling channel can be optimized with regard to the flow conditions that exist, since additive manufacturing methods can also produce complex structures without any increase in the manufacturing complexity. It is possible here, for example, to avoid dead volumes in the cooling channel in which circulation of the cooling fluid would be reduced. At the same time, subregions of the heat sink in which a greater amount of heat is introduced (depending on the component to be cooled) may be designed such that greater heat transfer is possible here (increased flow rate of the cooling fluid, increased supply of cooling area of the cooling structure).

In some embodiments, the base plate may be inserted into a system for additive manufacturing of the heat sink, and the cooling structure may be additively manufactured on the base plate. In this case, the base plate is used as an inexpensive semifinished product in order to produce the cooling structure directly thereon. The additive manufacturing simultaneously forms the purely metallic bond between the cooling structure and the metallic phase of the base plate. This can especially be effected by means of an SLM or an EBM because these methods assure welding of the metallic phase to the material of the cooling structure. However, the transition can also be created by sintering (SLS) or low-temperature welding (CGDS).

In some embodiments, an electronic circuit has been premounted on the base plate. This electronic circuit may then be inserted into the system for additive manufacturing, in which case the base plate is introduced into the system by the side on which the electronic circuit has not been premounted in such a way that this side is accessible to the additive construction of the cooling structure. In this way, it is possible to modify electronic circuits with regard to their cooling characteristics if these do not meet demands after the electronic circuit has been put into operation.

In some embodiments, the base plate is executed as part of a power electronics module. Such a module may have the properties that follow. The module may have been hermetically sealed. This is normally accomplished by a combination of an internal soft encapsulation, outer hard encapsulation, and outer plastic shell.

Load and control contacts are conducted out of the module, it being necessary to take account of insulation distances corresponding to the voltage class. The module is statically and dynamically tested by the manufacturer. The module is thus already usable.

The module is normally a standard component manufactured in large numbers. In some embodiments, these may be individualized by additively constructing the heat sink on the base plate. It is possible here to ensure that the module functions in the defined quality. The construction of the cooling structure advantageously does not lead to production of rejects. If the heat sink with base plate were first to be produced and the circuit were then to be realized thereon, by contrast, there could still be rejects owing to quality defects in the electronic circuit.

In some embodiments, the base plate is additively manufactured in the system for additive manufacturing from a mixture of a ceramic material and a metallic material. The metallic material here is melted or sintered since it has a lower melting point than the ceramic material. In this way, the metallic-ceramic composite of which the base plate consists is formed. Once the base plate is complete, the construction material in the system is changed and a metallic material is used to form the cooling structure. This method has the advantage that the heat sink can be matched individually to the specific case. In some embodiments, it is also possible to tailor the geometry of the mounting side to a particular electronic assembly, especially when the heat sink is to be placed onto individual components, for which geometrically adapted holders can be configured.

FIG. 1 shows a system with which an SLM can be conducted. This system has a process chamber 11 in which a build platform 12 for production of an additive structure is provided. Also provided is a powder reservoir 13. The powder reservoir 13 can be raised in the direction of the process chamber with the aid of a dosage cylinder 14, by means of which powder is provided and can be distributed as a layer on a bed of powder 16 by means of a distributor device 15 (for example a coating bar).

The build platform 12 is suitable for accommodating an electronic assembly 17 that can be held by the build platform 12 by a base plate 18 that is part of the electronic assembly 17. It is therefore possible to construct a cooling structure 19 on the base plate by solidifying, for example melting, the material of the powder bed 16. For this purpose, a laser 20 produces a laser beam 21 which is deflected via a deflecting mirror 22 through a window 23 into the process chamber 11 and melts particles of the powder bed 16. Thus, the cooling structure is produced layer by layer in that the build platform 12 with the electronic assembly 17 is lowered stepwise and new layers in the powder bed 16 are constantly produced with the distributor device 15.

The base plate 18 is part of the electronic assembly 17 and is formed from a metal-ceramic composite, especially from AlSiC. The cooling structure 19 is attached at the interface to the base plate 18 by melting and hence welding of the material (more of that hereinafter with regard to FIG. 5). The electronic assembly further consists of a ceramic substrate 24 that has copper metallization (not shown in detail) on both sides. Therefore, the substrate 24 and the base plate 18 can be bonded to one another via a solder bond of a joining aid 25 (solder material here). On the opposite mounting side of the substrate 24 from the base plate 18, an electronic component 26 has been mounted in the form of a power semiconductor, this having been effected by means of a solder bond (not shown in detail). Also provided is a bond 27 between the component 26 and the substrate 24. The electronic circuit is also sealed by an encapsulating compound 28, with electrical contact pins 29 projecting out of the encapsulating compound 28 and serving for electrical contacting of the component 26 in a manner not shown in detail.

Figure 2:
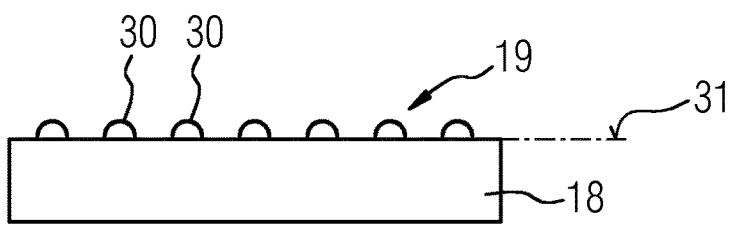
FIGS. 2 and 3 working examples of a heat sink incorporating teachings of the present disclosure in side view, FIG. 4 a working example of an electronic assembly incorporating teachings of the present disclosure with a working example of a heat sink incorporating teachings of the present disclosure, in partial cross section, and FIG. 5 the detail V in the cross section according to FIG. 3.

FIG. 2 shows a further example of a heat sink incorporating teachings of the present disclosure. This has a base plate 18 on which pimples 30 have been produced as cooling structure 19 by additive manufacturing. The pimples 30 increase the surface area of the heat sink, hence bettering its cooling performance. Also apparent is a plane 31 in which the transition between the base plate 18 and the cooling structure 19 lies.

Figure 3:
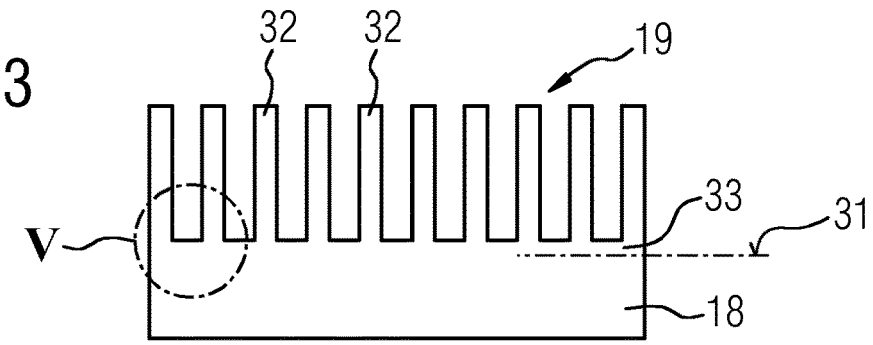

FIG. 3 shows another embodiment of the heat sink incorporating teachings of the present disclosure. This has fins 32 that are formed by the cooling structure 19. However, the cooling structure does not consist solely of the fins 32 but also of a layer 33 applied to the base plate. This layer 33 has the function of distributing the heat conducted via the metallic phase of the base plate 18 uniformly to the fins 32 by virtue of a connection to the base plate 18 over a large area. Otherwise, the heat could be removed from the base plate 18 in the interspaces between the fins 32 only under difficult conditions. A transition between the base plate 18 and the layer 33 lies in the plane 31.

Figure 4:
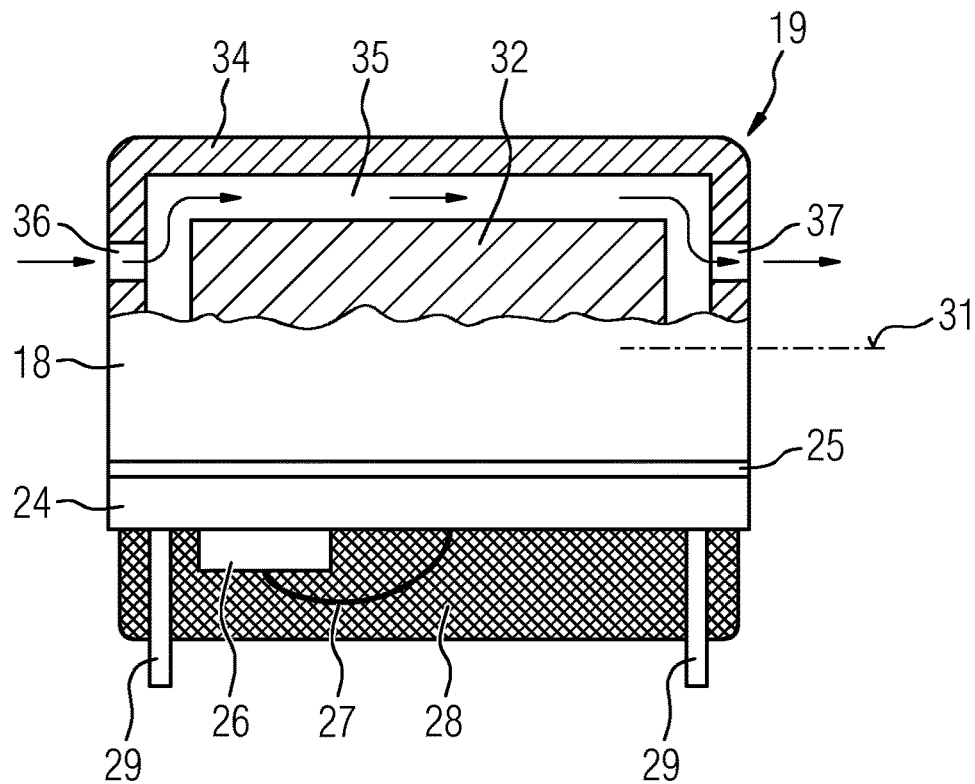

FIG. 4 shows an electronic assembly 17 corresponding to that of FIG. 1. However, the heat sink has special features that are to be elucidated in detail hereinafter. The heat sink has fins 32, one of which is shown in longitudinal section. In front of and behind the plane of the drawing according to FIG. 4, there are further fins that cannot be seen. The heat sink 19 is also supplemented by a housing structure 34 which has likewise been produced directly on the base plate 18 like the fins 32. In this way, a sealed cavity is formed, which can be utilized as channel 35 for conducting a cooling fluid, for example water. For this purpose, an inlet 36 and an outlet 37 are provided in the housing structure. The flow of the cooling medium is indicated by arrows.

Figure 5:
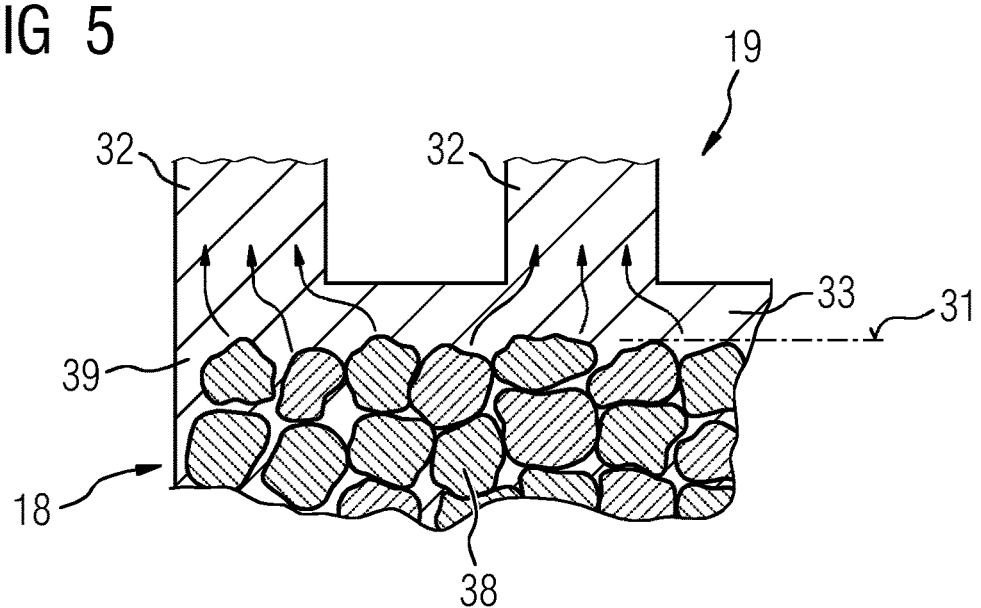

FIG. 5 shows the detail V according to FIG. 3. The section diagram shows a base plate 18 with a metal-matrix composite in which ceramic particles, for example of silicon carbide, form a ceramic phase 38 surrounded by a metallic matrix of aluminum that forms a metallic phase 39. The metallic phase therefore serves for good conduction of heat in the base plate 18 to the cooling structure 19. On the other hand, the comparatively high fill level of the ceramic phase 38 ensures that the thermal expansion characteristics of the base plate have been matched to those of a ceramic substrate 24 that can be attached to the base plate with the joining aid 25 according to FIG. 4.

Mechanical stresses arise at the boundary between the base plate 18 and the cooling structure 19 in the plane 31, where there is no longer any apparent phase boundary because the metallic material of the cooling structure 19 has been fused by laser melting to the metallic phase 39 of the base plate. However, the stability and elasticity of the metallic phase 39 and the cooling structure 19 are sufficient to cope with these thermal expansion-related stresses, the base plate 18 being designed to be thick enough for the resultant stresses to be dissipated down to the mounting surface of the heat sink (not shown in FIG. 5). (This is also true of the base plates of the heat sinks according to FIGS. 1, 2 and 4.)

FIG. 5 shows the layer 33 which is suitable for full-area binding of the cooling structure 19 to the base plate 18 and additionally stabilizes the fins 32. The layer 33 thus increases the mechanical stability of the heat sink and moreover improves the introduction of heat from the base plate 18 into the cooling structure 19 since, in the plane 31, the greatest possible surface area is available for this purpose (the heat flow is indicated in FIG. 5 by arrows).

What is claimed is:

1. A method of producing a heat sink for an electronic component, the method comprising:
fabricating a base plate comprising a metal-ceramic composite with a ceramic phase and a metallic phase, wherein the metallic phase comprises a metal alloy with a primary metal and one or more additional metals, wherein a content of the primary metal is greater than a respective content of any of the one or more additional metals;

mounting the electronic component or an interconnect for the electronic component on a first side of the base plate; and after mounting the electronic component or the interconnect on the base plate, fabricating a cooling structure on a second side opposite the first side of the base plate using an additive manufacturing process, wherein the additive manufacturing process melts the primary metal of the base plate;

wherein the cooling structure comprises the primary metal;

wherein the cooling structure defines a channel for a cooling medium; and a bond between the cooling structure and the base plate consists of a purely metallic bond formed between the primary metal of the cooling structure and the primary metal of the metallic phase of the base plate as the metallic phase of the base plate solidifies after melting in the additive manufacturing process;

wherein a first coefficient of thermal expansion of the electronic component matches a second coefficient of thermal expansion of the ceramic phase.

2. The method as claimed in claim 1, further comprising: inserting the base plate into a system for additively manufacturing the heat sink.

3. The method as claimed in claim 1, wherein the base plate comprises part of a power electronics module.

4. The method as claimed in claim 1, wherein the additive manufacturing method includes a selective laser melting method or an electron beam melting method.

* * * * *